(12) United States Patent
Isoi

(10) Patent No.: US 11,460,489 B2
(45) Date of Patent: Oct. 4, 2022

(54) ANALYSIS CONTROL SYSTEM

(71) Applicant: SHIMADZU CORPORATION, Kyoto (JP)

(72) Inventor: Takuya Isoi, Kyoto (JP)

(73) Assignee: SHIMADZU CORPORATION, Kyoto (JP)

(*) Notice: Subject to any disclaimer, the term of this patent is extended or adjusted under 35 U.S.C. 154(b) by 870 days.

(21) Appl. No.: 16/321,120

(22) PCT Filed: Jul. 29, 2016

(86) PCT No.: PCT/JP2016/072299
§ 371 (c)(1),
(2) Date: Jan. 28, 2019

(87) PCT Pub. No.: WO2018/020655
PCT Pub. Date: Feb. 1, 2018

(65) Prior Publication Data
US 2019/0162763 A1 May 30, 2019

(51) Int. Cl.
G01R 22/06 (2006.01)
G05B 23/02 (2006.01)
(Continued)

(52) U.S. Cl.
CPC ......... *G01R 22/06* (2013.01); *G01N 30/8651* (2013.01); *G01N 30/88* (2013.01);
(Continued)

(58) Field of Classification Search
CPC ...... G01R 22/06; G01R 21/133; G01R 22/00; G01N 30/8651; G01N 30/88; G01N 30/64;
(Continued)

(56) References Cited

U.S. PATENT DOCUMENTS 8,725,442 B2 * 5/2014 Kondo ............... G01R 27/28
702/66
9,297,841 B2 * 3/2016 Chun ................. G01D 1/00
(Continued)

FOREIGN PATENT DOCUMENTS

CN 201535825 U * 7/2010 ............ G01V 5/00
CN 102369491 A 3/2012
(Continued)

OTHER PUBLICATIONS

Susan, Development and Evaluation of a Reference Measurement Procedure for the Determination of Estradiol-17â in Human Serum Using Isotope-Dilution Liquid Chromatography-Tandem Mass Spectrometry, Anal. Chem. 2005, 77, 6359-6363 (Year: 2005).*
(Continued)

*Primary Examiner* — Tung S Lau
(74) *Attorney, Agent, or Firm* — Sughrue Mion, PLLC

(57) ABSTRACT

A first power consumption measuring unit 5 measures only the power consumption of a pump 21 that is a reference unit of a liquid chromatograph 2. A second power consumption measuring unit 6 measures only the power consumption of a gas chromatograph main body 31 that is a reference unit of a gas chromatograph 3. An operating information acquiring unit acquires pieces of operating information on an automatic sampler 22, an oven 23, and a detector 24 that are target units of the liquid chromatograph 2 based on information on the power consumption of the pump 21. The operating information acquiring unit acquires the operating information on a head space sampler 32 that is a target unit of the gas chromatograph 3 based on information on the power consumption of the gas chromatograph main body 31. Thus, even in the case where the analyzer includes many target units, only the power consumption of the reference units is measured, and the operating time period calculating unit can acquire the pieces of operating information on the
(Continued)

target units from the power consumption of the reference units.

7 Claims, 6 Drawing Sheets

(51) Int. Cl.
  *G01R 21/133*    (2006.01)
  *G01R 22/00*    (2006.01)
  *G01N 30/86*    (2006.01)
  *G01N 30/88*    (2006.01)
  *G01N 30/64*    (2006.01)
  *G01N 30/02*    (2006.01)

(52) U.S. Cl.
  CPC ........... *G01R 21/133* (2013.01); *G01R 22/00* (2013.01); *G05B 23/02* (2013.01); *G01N 30/64* (2013.01); *G01N 2030/025* (2013.01); *G01N 2030/027* (2013.01); *G01N 2030/8804* (2013.01)

(58) Field of Classification Search
  CPC ....... G01N 2030/025; G01N 2030/027; G01N 2030/8804; G05B 23/02
  See application file for complete search history.

(56) References Cited

U.S. PATENT DOCUMENTS

| | | | |
|---|---|---|---|
| 9,411,009 B1* | 8/2016 | Aguayo Gonzalez | ........................ G01R 31/2832 |
| 9,910,081 B2* | 3/2018 | Biswas | ................ G01R 31/088 |
| 10,768,215 B2* | 9/2020 | Leibfritz | ................ G01R 29/06 |
| 2011/0316559 A1* | 12/2011 | Haffner | ................ G01R 31/11 324/612 |
| 2012/0078670 A1 | 3/2012 | Yamamura et al. | |
| 2016/0342791 A1* | 11/2016 | Aguayo Gonzalez | ........................ G01R 31/2893 |

FOREIGN PATENT DOCUMENTS

| | | |
|---|---|---|
| JP | 2004-070424 A | 3/2004 |
| JP | 2008-97128 A | 4/2008 |

OTHER PUBLICATIONS

International Search Report of PCT/JP2016/072299 dated Sep. 27, 2016 [PCT/ISA/210].
Written Opinion dated Sep. 27, 2016 in application No. PCT/JP2016/072299.
Communication dated Aug. 13, 2020 from the China National Intellectual Property Administration in Application No. 201680088117.7.

* cited by examiner

ANALYSIS CONTROL SYSTEM

TECHNICAL FIELD

The present invention relates to an analysis control system that acquires operating information on a plurality of analyzers.

BACKGROUND ART

Heretofore, technologies are used with which a system manages the operating status of various machines. For example, a system is proposed in which the system automatically acquires operating information on machines that are to be used for a long time and determines the operating states of these machines (operating time periods, for example) based on this information. The determined result obtained in this system is used as information in determination of the timing of maintenance, for example, that has to be performed (e.g. see Patent Document 1).

In the system described in Patent Document 1, signals related to the power consumption of machines are acquired as operating information, and operating states are determined based on the signals. The signals related to power consumption are signals generated as a result of the operation of the machines. Thus, the operating states of the machines are properly determined.

PRIOR ART DOCUMENT

Patent Document

Patent Document 1: JP 2004-70424 A

SUMMARY OF THE INVENTION

Problems to be Solved by the Invention

In the previously existing system, in the case where machines targeted for management are increased, the number of systems has to be increased corresponding to the number of machines. In this case, the overall configuration becomes complicated, and costs are also increased, which cause problems. For example, as in analyzers, such as chromatographs, in the case where, in a machine provided with a plurality of units, the operating status of the units are desired to be managed, systems have to be configured corresponding to the number of the units, resulting in problems of complicated configurations and an increase in costs.

The present invention is made in view of the circumstances. An object of the present invention is to provide an analysis control system that can manage the operating status of a plurality of units with a simple configuration.

Means for Solving the Problems (1) An analysis control system according to the present invention includes a plurality of analyzers, a plurality of power consumption measuring units, and an operating information acquiring unit. The plurality of analyzers analyze a sample using a plurality of units. The plurality of power consumption measuring units measure power consumption of a reference unit included in the plurality of units of the analyzers. The operating information acquiring unit acquires operating information on a target unit that is a unit other than the reference unit of the analyzers based on the power consumption of the reference units measured at the power consumption measuring units.

According to such a configuration, the power consumption measuring unit measures only the power consumption of the reference units included in the plurality of units of the analyzer. The operating information acquiring unit acquires pieces of operating information on the target units of the analyzers based on the power consumption of the reference units.

Thus, even in the case where the analyzers include many target units, the power consumption measuring unit measures only the power consumption of the reference units, and the operating information acquiring unit can acquire the pieces of operating information on the target units from the power consumption of the reference units.

As a result, the pieces of operating information on the target units can be acquired with no provision of configurations in which the power consumption of the target units is directly measured.

Accordingly, the operating status of a plurality of units can be managed with a simple configuration.

(2) The reference unit may be a unit having a highest operating rate in the plurality of units of the analyzers.

According to such a configuration, compared with the case where a unit having a low operating rate is a reference unit, the error rate in the measurement of power consumption by the power consumption measuring unit can be made smaller. The operating information acquiring unit acquires the pieces of operating information on the target units from the power consumption. Thus, compared with the case where a unit having a low operating rate is a reference unit, the pieces of operating information on the target units can be highly accurately acquired.

(3) The analysis control system may further include an operating time period calculating unit and a storage unit. The operating time period calculating unit calculates operating time periods of the reference units based on the power consumption of the reference units measured at the power consumption measuring units. The storage unit memorizes a ratio of the operating time periods between the reference unit and the target unit of the analyzers as device configuration information. The operating information acquiring unit may acquire the operating time period of the target unit as the operating information based on the operating time periods of the reference units calculated at the operating time period calculating unit and the device configuration information memorized on the storage unit.

According to such a configuration, the operating time period calculating unit calculates the operating time periods of the reference units. The operating information acquiring unit acquires the operating time periods of the target units based on the operating time period of the reference unit and the device configuration information in the storage unit.

Thus, in the analysis control system, the operating time periods of the units can be managed. For example, the maintenance timing of the units can be properly determined based on information on the operating time periods.

(4) The analysis control system may further include an input accepting unit and an information rewrite processing unit. The input accepting unit accepts an input of the device configuration information. In the case where the input accepting unit accepts an input of the device configuration information, the information rewrite processing unit rewrites the device configuration information memorized on the storage unit.

According to such a configuration, the input accepting unit accepts the input of the device configuration information, and hence the device configuration information memorized on the storage unit can be rewritten to the newest information. The operating information acquiring unit can acquire operating information on the target unit based on the newest device configuration information.

(5) The plurality of power consumption measuring units may include an operating time period calculating unit and a storage unit. The operating time period calculating unit calculates the operating time periods of the reference units based on the power consumption of the reference units measured at the power consumption measuring units. The storage unit memorizes a ratio of the operating time periods between the reference unit and the target unit of the analyzers as device configuration information. The operating information acquiring unit may acquire the operating time period of the target unit as the operating information based on the operating time periods of the reference units calculated at the operating time period calculating unit and the device configuration information memorized on the storage unit.

According to such a configuration, the operating time period calculating unit and the storage unit are included in the power consumption measuring unit.

Thus, the members other than the power consumption measuring unit of the analysis control system can be simply configured.

In the analysis control system, the operating time period calculating unit calculates the operating time periods of the reference units. The operating information acquiring unit acquires the operating time periods of the target units based on the operating time period of the reference unit and the device configuration information in the storage unit.

Thus, in the analysis control system, the operating time periods of the units can be managed. For example, the maintenance timing of the units can be properly determined based on information on the operating time periods.

(6) The analysis control system may further include a setting information acquiring unit. The setting information acquiring unit acquires setting information on operation of a plurality of components included in the plurality of units. The operating information acquiring unit may acquire operating information on the components based on setting information on the components acquired at the setting information acquiring unit.

According to such a configuration, the operating information acquiring unit can acquire operating information on the components in addition to the pieces of operating information on the units.

Thus, in addition to the operating status of the units, the operating status of the components can be managed.

(7) The analysis control system may further include an error information acquiring unit. The error information acquiring unit acquires error information on the plurality of components of the analyzers. The operating information acquiring unit may acquire operating information on the components based on setting information on the components acquired at the setting information acquiring unit and error information on the components acquired at the error information acquiring unit.

According to such a configuration, in the case where errors occur in the components, the error information on the errors can be reflected on the operating information acquired at the operating information acquiring unit.

As a result, the operating information acquiring unit can highly accurately acquire operating information on the components.

Effects of the Invention

According to the present invention, even in the case where the analyzers include many target units, the power consumption measuring unit measures only the power consumption of the reference units, and the operating information acquiring unit can acquire the pieces of operating information on the target units from the power consumption of the reference units. Thus, the pieces of operating information on the target units can be acquired with no provision of configurations in which the power consumption of the target units is directly measured. As a result, the operating status of a plurality of units can be managed with a simple configuration.

MODE FOR CARRYING OUT THE INVENTION

1. Overall Configuration of Analysis Control System

Figure 1:
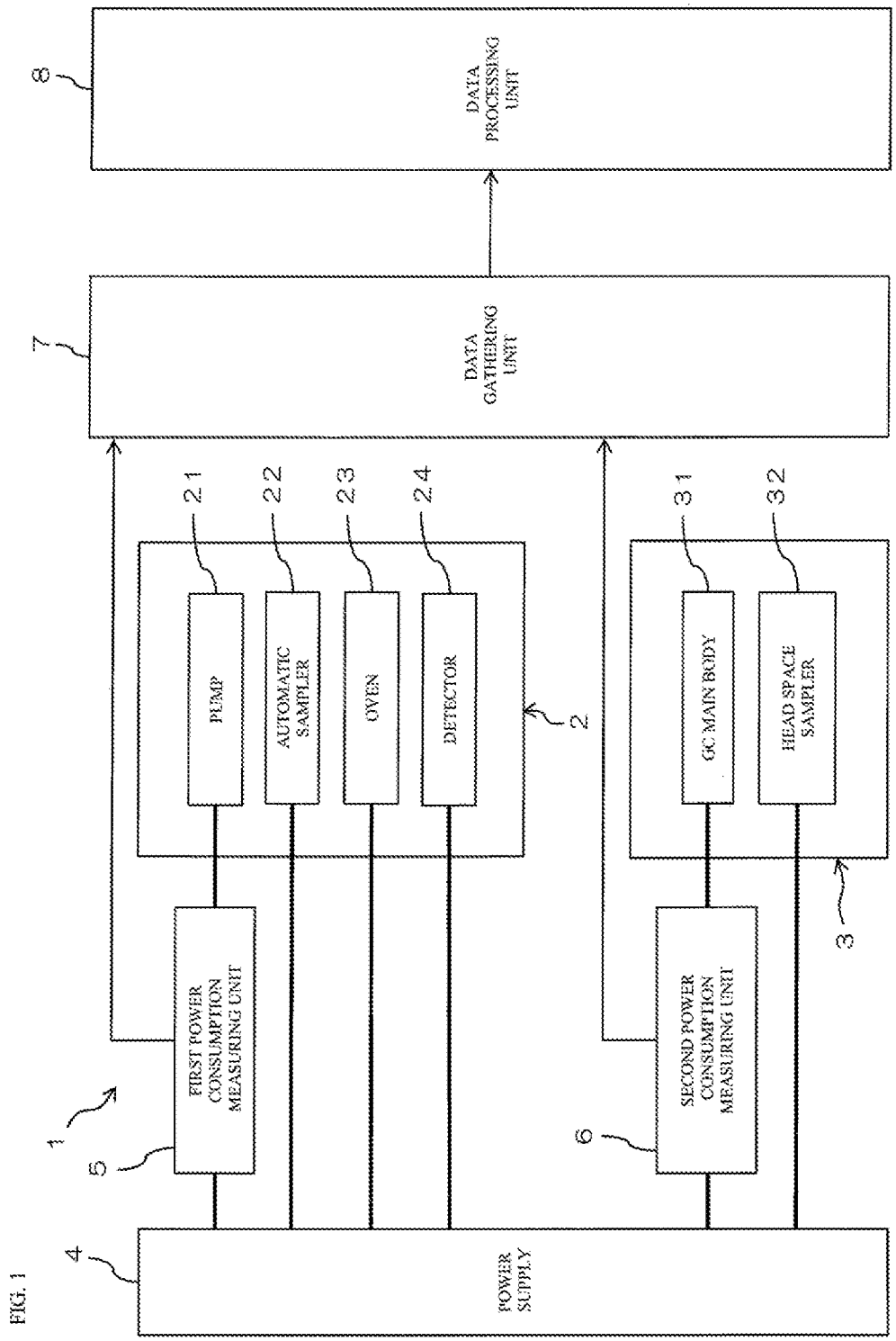
FIG. 1 is a schematic diagram of the configuration of an analysis control system according to a first embodiment of the present invention.

FIG. 1 is a schematic diagram of the configuration of an analysis control system 1 according to a first embodiment of the present invention.

The analysis control system 1 is a system including a plurality of analyzers. The system acquires (manages) pieces of operating information on units included in the analyzers. Specifically, the analysis control system 1 includes a liquid chromatograph 2 and a gas chromatograph 3 as examples of analyzers. In addition to these analyzers, the analysis control system 1 includes a power supply 4, a first power consumption measuring unit 5, a second power consumption measuring unit 6, a data gathering unit 7, and a data processing unit 8.

The liquid chromatograph 2 includes, as units, a pump 21, an automatic sampler 22, an oven 23, and a detector 24. In the liquid chromatograph 2, the pump 21 is an example of a reference unit, and the automatic sampler 22, the oven 23, and the detector 24 are examples of target units.

The pump 21 is a unit having the highest operating rate in the plurality of units of the liquid chromatograph 2.

The members (the pump 21, the automatic sampler 22, the oven 23, and the detector 24) of the liquid chromatograph 2 are electrically connected to the power supply 4, and electric power is supplied from the power supply 4.

In the liquid chromatograph 2, the pump 21 is operated to deliver a mobile phase to passages in the liquid chromatograph 2. From the automatic sampler 22, a sample is injected into the corresponding passage. The sample is carried to a separation column in the oven 23, and separated into components. The components are introduced from this separation column into the detector 24. In the detector 24, the sample components are detected. A user analyzes the sample based on the detected result.

The gas chromatograph 3 includes, as units, a gas chromatograph main body (a GC main body) 31 and a head space sampler 32. In the gas chromatograph 3, the gas chromatograph main body 31 is an example of a reference unit, and the head space sampler 32 is an example of a target unit.

The gas chromatograph main body 31 is a unit having the highest operating rate in the plurality of units of the gas chromatograph 3. The gas chromatograph main body 31 includes a column, a column oven, a sample introduction unit, a detector, a gas supply unit (not shown), and the like.

The gas chromatograph main body 31 and the head space sampler 32 are electrically connected to the power supply 4, and electric power is supplied from the power supply 4.

In the gas chromatograph 3, a sample is injected from the head space sampler 32 into the sample introduction unit in the gas chromatograph main body 31. The sample is vaporized in the sample introduction unit. In the gas chromatograph main body 31, a carrier gas is supplied from the gas supply unit to the sample introduction unit. The vaporized sample is introduced into the column together with the carrier gas, separated into various sample components in the process of passing the sample through the inside of the column, and then in turn introduced into the detector. In the detector, the sample components are in turn detected. The user analyzes the sample based on the detected result.

As described above, in the analysis control system 1, and electric power is individually supplied from the power supply 4 to the units of the analyzer. Specifically, the pump 21, the automatic sampler 22, the oven 23, and the detector 24 of the liquid chromatograph 2 and the gas chromatograph main body 31 and the head space sampler 32 of the gas chromatograph 3 are individually electrically connected to the power supply 4, and electric power is individually supplied from the power supply 4.

The first power consumption measuring unit 5 is disposed in a circuit on which electric power is supplied from the power supply 4 to the liquid chromatograph 2. Specifically, the first power consumption measuring unit 5 is disposed in a circuit on which electric power is supplied from the power supply 4 to the pump 21, and configured to measure the power consumption of the pump 21.

The second power consumption measuring unit 6 is disposed in a circuit on which electric power is supplied from the power supply 4 to the gas chromatograph 3. Specifically, the second power consumption measuring unit 6 is disposed in a circuit on which electric power is supplied from the power supply 4 to the gas chromatograph main body 31, and configured to measure the power consumption of the gas chromatograph main body 31.

The data gathering unit 7 receives inputs of signals related to the power consumption of the pump 21 measured at the first power consumption measuring unit 5 and signals related to power consumption of the gas chromatograph main body 31 measured at the second power consumption measuring unit 6. That is, the data gathering unit 7 gathers information on the power consumption of the pump 21 measured at the first power consumption measuring unit 5 and information on the power consumption of the gas chromatograph main body 31 measured at the second power consumption measuring unit 6. Note that the data gathering unit 7 may compress data, for example, and then gather the compressed data.

The data processing unit 8 receives the input of signals related to data gathered at the data gathering unit 7. The data processing unit 8 acquires the pieces of operating information on the units of the analyzers (the liquid chromatograph 2 and the gas chromatograph 3) based on the inputted signals as described later.

In the analysis control system 1, the power consumption of the reference units of the analyzers is measured, and the operating time periods of the reference units are calculated based on information. The operating time periods of the target units of the analyzers are then calculated based on the calculated operating time periods of the reference units.

Specifically, in the analysis control system 1, the first power consumption measuring unit 5 measures the power consumption of the pump 21 that is the reference unit of the liquid chromatograph 2. The data gathering unit 7 gathers the information on the power consumption of the pump 21 measured at the first power consumption measuring unit 5. Although described later in detail, the data processing unit 8 acquires operating information on the automatic sampler 22, the oven 23, and the detector 24 that are the target units of the liquid chromatograph 2 based on data (information on the power consumption of the pump 21) gathered at the data gathering unit 7. In the analysis control system 1, the second power consumption measuring unit 6 measures the power consumption of the gas chromatograph main body 31 that is the reference unit of the gas chromatograph 3. The data gathering unit 7 gathers the information on the power consumption of the gas chromatograph main body 31 measured at the second power consumption measuring unit 6. Although described later in detail, the data processing unit 8 acquires the operating information on the head space sampler 32 that is the target unit of the gas chromatograph 3 based on data (the information on the power consumption of the gas chromatograph main body 31) gathered at the data gathering unit 7.

As described above, in the analysis control system 1, only the power consumption of the reference units of the analyzers is measured, and the power consumption of target units other than the reference units is not measured. In the analysis control system 1, the pieces of operating information on the target units of the analyzers are acquired based on information on the power consumption of the reference units.

Figure 2:
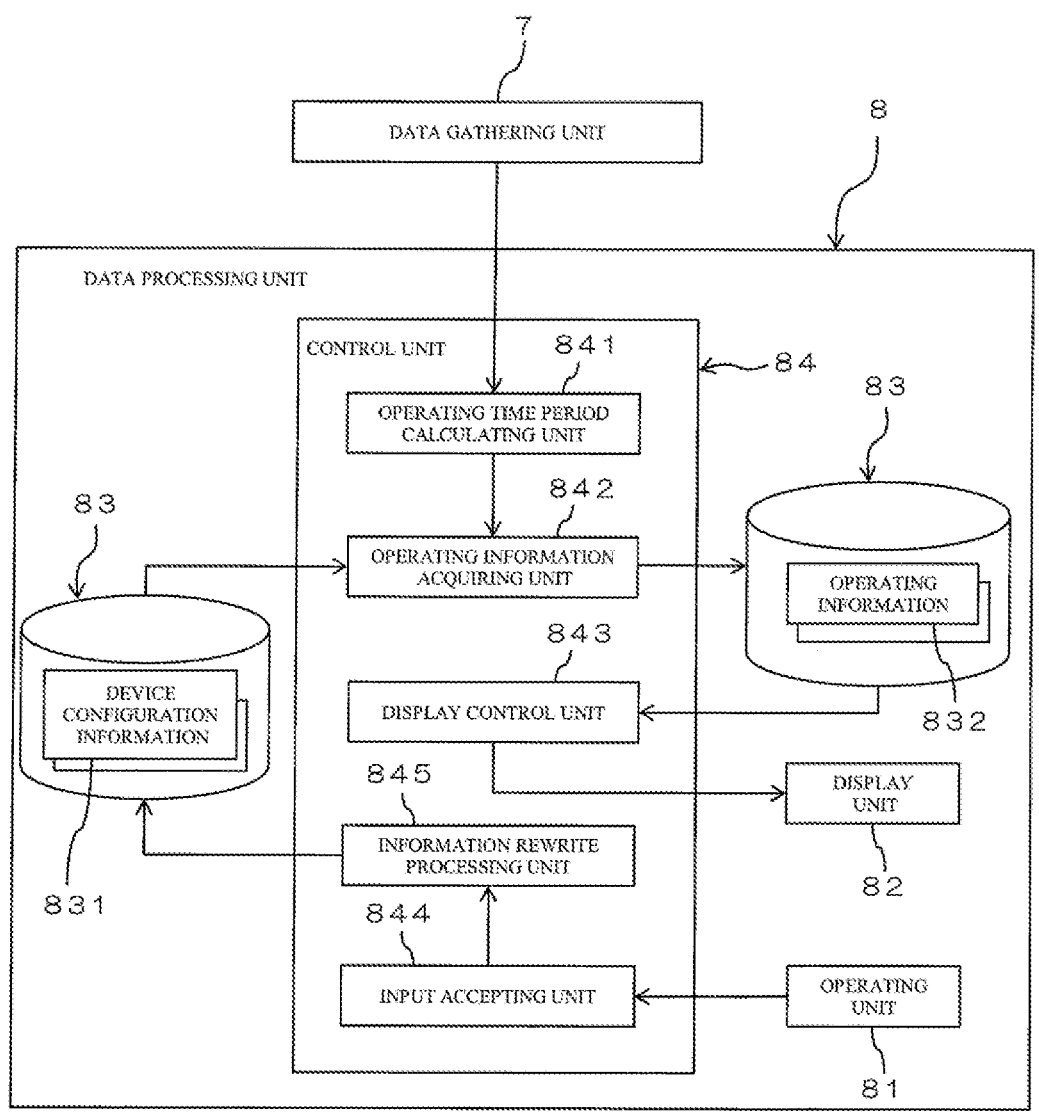
FIG. 2 is a block diagram of the specific configurations of a data processing unit and peripheral members around the data processing unit of the analysis control system in FIG. 1.

2. Specific Configurations of Data Processing Unit and Peripheral Members around Data Processing Unit FIG. 2 is a block diagram of the specific configurations of the data processing unit 8 and the peripheral members around the data processing unit 8 of the analysis control system 1 in FIG. 1. The data processing unit 8 includes an operating unit 81, a display unit 82, a storage unit 83, and a control unit 84.

The operating unit 81 is configured with a keyboard and a mouse, for example. The user can input various pieces of information to the control unit 84 by operating the operating unit 81.

The display unit 82 is configured with a liquid crystal display device, for example. On the display unit 82, various pieces of information, such as the pieces of operating information on the units of the analyzers, are displayed by the control of the control unit 84.

The storage unit 83 is configured with a read only memory (ROM), a random access memory (RAM), and a hard disk, for example. The storage unit 83 memorizes a plurality (two)

of pieces of device configuration information 831 and a plurality (two) of pieces of operating information 832.

The device configuration information 831 is information on the ratio of the operating time periods between the reference unit and the target unit of the analyzers (the liquid chromatograph 2 and the gas chromatograph 3).

Specifically, one piece of the device configuration information 831 includes information on the ratio of the operating time periods between the pump 21 and the automatic sampler 22, information on the ratio of the operating time periods between the pump 21 and the oven 23, and information on the ratio of the operating time periods between the pump 21 and the detector 24. For example, the ratio of the operating time periods between the pump 21 and the automatic sampler 22 is 1:0.5, the ratio of the operating time periods between the pump 21 and the oven 23 is 1:1, and the ratio of the operating time periods between the pump 21 and the detector 24 is 1:0.7.

The other piece of the device configuration information 831 includes information on the ratio of the operating time periods between the gas chromatograph main body 31 and the head space sampler 32. For example, the ratio of the operating time periods between the gas chromatograph main body 31 and the head space sampler 32 is 1:0.5.

The operating information 832 is information on the operating status of the units of the analyzers acquired at the control unit 84. In the operating information 832, dates and time at which the units of the analyzers are operated, the operating time periods on the corresponding date and time, and the total operating time period that the operating time periods are added are in association with one another.

The control unit 84 includes a central processing unit (CPU), for example. The control unit 84 can input or output electrical signals between the operating unit 81 and the display unit 82. The control unit 84 stores information in the storage unit 83, and reads information memorized on the storage unit 83 as necessary. The control unit 84 functions as an operating time period calculating unit 841, an operating information acquiring unit 842, a display control unit 843, an input accepting unit 844, and an information rewrite processing unit 845, for example, by the CPU that executes programs.

The operating time period calculating unit 841 receives the input of signals from the data gathering unit 7. The operating time period calculating unit 841 calculates the operating time periods of the reference units based on information on the power consumption of the reference units gathered at the data gathering unit 7. That is, the operating time period calculating unit 841 calculates the operating time periods of the reference units based on information on the power consumption of the reference units measured at the first power consumption measuring unit 5 and the second power consumption measuring unit 6. Specifically, the operating time period calculating unit 841 calculates the operating time period of the pump 21 of the liquid chromatograph 2 based on information on the power consumption of the pump 21 of the liquid chromatograph 2 gathered at the data gathering unit 7. The operating time period calculating unit 841 calculates the operating time period of the gas chromatograph main body 31 of the gas chromatograph 3 based on information on the power consumption of the gas chromatograph main body 31 of the gas chromatograph 3 gathered at the data gathering unit 7.

The operating information acquiring unit 842 acquires the operating time periods of the target units of the analyzers as operating information based on the information on the operating time periods of the reference units calculated at the operating time period calculating unit 841 and the device configuration information 831 memorized on the storage unit 83. That is, the operating information acquiring unit 842 acquires the operating time periods of the target units of the analyzers as operating information based on information on the power consumption of the reference units measured at the first power consumption measuring unit 5 and the second power consumption measuring unit 6. This information is stored as the operating information 832 on the storage unit 83. Specifically, the operating information acquiring unit 842 acquires, as operating information, the operating time periods of the units (the automatic sampler 22, the oven 23, and the detector 24) other than the pump 21 of the liquid chromatograph 2 based on the operating time period of the pump 21 of the liquid chromatograph 2 calculated at the operating time period calculating unit 841, and the device configuration information 831 memorized on the storage unit 83. The operating information acquiring unit 842 acquires the operating time period of the unit (the head space sampler 32) as operating information other than the gas chromatograph main body 31 of the gas chromatograph 3 based on the operating time period of the gas chromatograph main body 31 of the gas chromatograph 3 calculated at the operating time period calculating unit 841 and the device configuration information 831 memorized on the storage unit 83.

The display control unit 843 displays the operating status of the units based on the operating information 832 memorized on the storage unit 83.

The input accepting unit 844 accepts a change related to the device configuration information 831 (the input of the device configuration information 831) based on the user operation of the operating unit 81.

The information rewrite processing unit 845 rewrites the device configuration information 831 memorized on the storage unit 83 based on the content accepted at the input accepting unit 844.

3. Control Operation by Control Unit

After the analysis operation is performed in the liquid chromatograph 2 and the gas chromatograph 3, the first power consumption measuring unit 5 measures the power consumption of the pump 21 of the liquid chromatograph 2, and the second power consumption measuring unit 6 measures the power consumption of the gas chromatograph main body 31 of the gas chromatograph 3. The data gathering unit 7 gathers information on power consumption measured at the first power consumption measuring unit 5 and the second power consumption measuring unit 6.

Signals related to the information (the information on the power consumption of the pump 21 and the information on the power consumption of the gas chromatograph main body 31) gathered at the data gathering unit 7 are inputted to the operating time period calculating unit 841 of the control unit 84 (the data processing unit 8).

The operating time period calculating unit 841 calculates the operating time period of the pump 21 of the liquid chromatograph 2 and the operating time period of the gas chromatograph main body 31 of the gas chromatograph 3 based on the signals from the data gathering unit 7.

The operating information acquiring unit 842 acquires the operating time periods of the automatic sampler 22, the oven 23, and the detector 24 that are the target units of the liquid chromatograph 2, and the operating time period of the head space sampler 32 that is the target unit of the gas chromatograph 3 based on the operating time periods (the operating time period of the pump 21 and the operating time period of the gas chromatograph main body 31) calculated at the operating time period calculating unit 841 and the device configuration information 831 memorized on the storage unit 83.

As described above, in the device configuration information 831 (the device configuration information 831 related to the liquid chromatograph 2), the ratio of the operating time periods between the pump 21 and the automatic sampler 22 is 1:0.5, for example. Thus, the operating time period of the automatic sampler 22 is acquired (calculated) by multiplying the operating time period of the pump 21 calculated at the operating time period calculating unit 841 by 0.5. In the device configuration information 831, the ratio of the operating time periods between the pump 21 and the oven 23 is 1:1, for example. Thus, the operating time period of the oven 23 is acquired (calculated) as the same time period as the operating time period of the pump 21 calculated at the operating time period calculating unit 841. In the device configuration information 831, the ratio of the operating time periods between the pump 21 and the detector 24 is 1:0.7, for example. Thus, the operating time period of the detector 24 is acquired (calculated) by multiplying the operating time period of the pump 21 calculated at the operating time period calculating unit 841 by 0.7.

Similarly, in the device configuration information 831 (the device configuration information 831 on the gas chromatograph 3), the ratio of the operating time periods between the gas chromatograph main body 31 and the head space sampler 32 is 1:0.5, for example. Thus, the operating time period of the head space sampler 32 is acquired (calculated) by multiplying the operating time period of the pump 21 calculated at the operating time period calculating unit 841 by 0.5.

The operating time periods of the units (the operating time periods of the pump 21, the automatic sampler 22, the oven 23, and the detector 24 of the liquid chromatograph 2, and the operating time periods of the gas chromatograph main body 31 and the head space sampler 32 of the gas chromatograph 3) thus acquired are stored as the operating information 832 on the storage unit 83 in association with the acquired dates and time.

In the analysis control system 1, operating time periods of the units are acquired as described above every time when the liquid chromatograph 2 and the gas chromatograph 3 are operated. The operating time periods of the units are stored as the operating information 832 on the storage unit 83. At this time, on the storage unit 83, information on the total operating time period of the units is stored as the operating information 832, in addition to the operating dates and time of the units and information on the operating time on the corresponding date and time.

The display control unit 843 displays the content of the operating information 832 memorized on the storage unit 83 as the operating status of the units on the display unit 82. Note that the display control unit 843 may display the content of the operating information 832 on the display unit 82 at a predetermined timing, or may display the content of the operating information 832 on the display unit 82 in response to the user operation on the operating unit 81.

The user determines the maintenance timing of the units, for example, by the confirmation of the operating status (the operating time periods) of the units displayed on the display unit 82.

In the case where the device configuration information 831 of the storage unit 83 is changed, the user operates the operating unit 81 to input new device configuration information 831. The input accepting unit 844 accepts the input of new device configuration information 831. The information rewrite processing unit 845 rewrites the device configuration information 831 memorized on the storage unit 83 based on the new information accepted at the input accepting unit 844. As described above, the rewritten device configuration information 831 is used at the operating information acquiring unit 842 when the operating time periods of the units are calculated.

Note that the input accepting unit 844 only has to be configured to accept the input of the device configuration information 831, and may have a configuration other than the configuration in which an input is accepted by the operation of the operating unit 81. For example, the input accepting unit 844 may accept the input of device configuration information 831 generated and outputted in the analysis control system 1. The input accepting unit 844 may accept the input of device configuration information 831 generated and outputted from an external system. The input accepting unit 844 may issue a command in the analysis control system 1 and automatically accept the input of device configuration information 831 generated and outputted on an external system in response to the command.

4. Operation and Effect (1) In the embodiment, in the analysis control system 1 as illustrated in FIG. 1, the first power consumption measuring unit 5 measures only the power consumption of the pump 21 that is the reference unit of the liquid chromatograph 2. The second power consumption measuring unit 6 measures only the power consumption of the gas chromatograph main body 31 that is the reference unit of the gas chromatograph 3. The data gathering unit 7 gathers these pieces of information. As illustrated in FIG. 2, the operating information acquiring unit 842 of the data processing unit 8 acquires the pieces of operating information on the automatic sampler 22, the oven 23, and the detector 24 that are the target units of the liquid chromatograph 2 based on information on the power consumption of the pump 21 of the liquid chromatograph 2 gathered at the data gathering unit 7. The operating information acquiring unit 842 of the data processing unit 8 acquires the operating information on the head space sampler 32 that is the target unit of the gas chromatograph 3 based on information on the power consumption of the gas chromatograph main body 31 of the gas chromatograph 3 gathered at the data gathering unit 7.

Thus, even in the case where the liquid chromatograph 2 includes many target units, the first power consumption measuring unit 5 measures only the power consumption of the pump 21, and the operating time period calculating unit 841 can acquire the pieces of operating information on the target units from the power consumption of the pump 21. Similarly, even in the case where the gas chromatograph 3 includes many target units, the second power consumption measuring unit 6 measures only the power consumption of the gas chromatograph main body 31, and the operating time period calculating unit 841 can acquire the pieces of operating information on the target units from the power consumption of the gas chromatograph main body 31.

As a result, the pieces of operating information on the target units can be acquired with no provision of configurations in which the power consumption of the target units of the liquid chromatograph 2 and the power consumption of the target units of the gas chromatograph 3 are directly measured.

Accordingly, the operating status of a plurality of units can be managed with a simple configuration.

(2) In the embodiment, in the liquid chromatograph 2, the reference unit is the pump 21 that is a unit having the highest operating rate in the plurality of units. In the gas chromatograph 3, the reference unit is the gas chromatograph main body 31 that is a unit having the highest operating rate in the plurality of units.

Thus, compared with the case where a unit having a low operating rate is a reference unit, the error rate in the measurement of power consumption by the first power consumption measuring unit 5 and the error rate in the measurement of power consumption by the second power consumption measuring unit 6 can be made smaller. The operating information acquiring unit 842 acquires operating information on the units (the target units) other than the pump 21 of the liquid chromatograph 2 from the power consumption of the pump 21, and operating information on the units (the target units) other than the gas chromatograph main body 31 of the gas chromatograph 3 from the power consumption of the gas chromatograph main body 31. As a result, compared with the case where a unit having a low operating rate is a reference unit, the pieces of operating information on the target units can be highly accurately acquired.

(3) In the embodiment, in the analysis control system 1, the operating time period calculating unit 841 calculates the operating time period of the pump 21 of the liquid chromatograph 2. As illustrated in FIG. 2, the operating information acquiring unit 842 acquires the operating time periods of the units (the target units) other than the pump 21 of the liquid chromatograph 2 based on the operating time period of the pump 21 and the device configuration information 831 of the storage unit 83. Similarly, in the embodiment, the operating time period calculating unit 841 calculates the operating time period of the gas chromatograph main body 31 of the gas chromatograph 3. The operating information acquiring unit 842 acquires the operating time periods of the units (the target units) other than the gas chromatograph main body 31 of the gas chromatograph 3 based on the operating time period of the gas chromatograph main body 31 and the device configuration information 831 of the storage unit 83.

Thus, in the analysis control system 1, the operating time periods of the units can be managed. The maintenance timing of the units can be properly determined based on information on the operating time periods.

(4) In the embodiment, in the analysis control system 1, the input accepting unit 844 accepts a change related to the device configuration information 831 (the input of the device configuration information 831) based on the user operation of the operating unit 81. The information rewrite processing unit 845 rewrites the device configuration information 831 memorized on the storage unit 83 based on the content accepted at the input accepting unit 844.

Thus, the input accepting unit 844 accepts the input of information, and hence the device configuration information 831 memorized on the storage unit 83 can be rewritten to the newest information. The operating information acquiring unit 842 can acquire the pieces of operating information on the target units based on the newest device configuration information 831.

5. Second Embodiment

In the following, referring to FIGS. 3 and 4, a second embodiment of the present invention will be described. Note that in the second embodiment and a third embodiment below, configurations similar to the configurations of the first embodiment are designated with the same reference signs, and the description is omitted.

Figure 3:
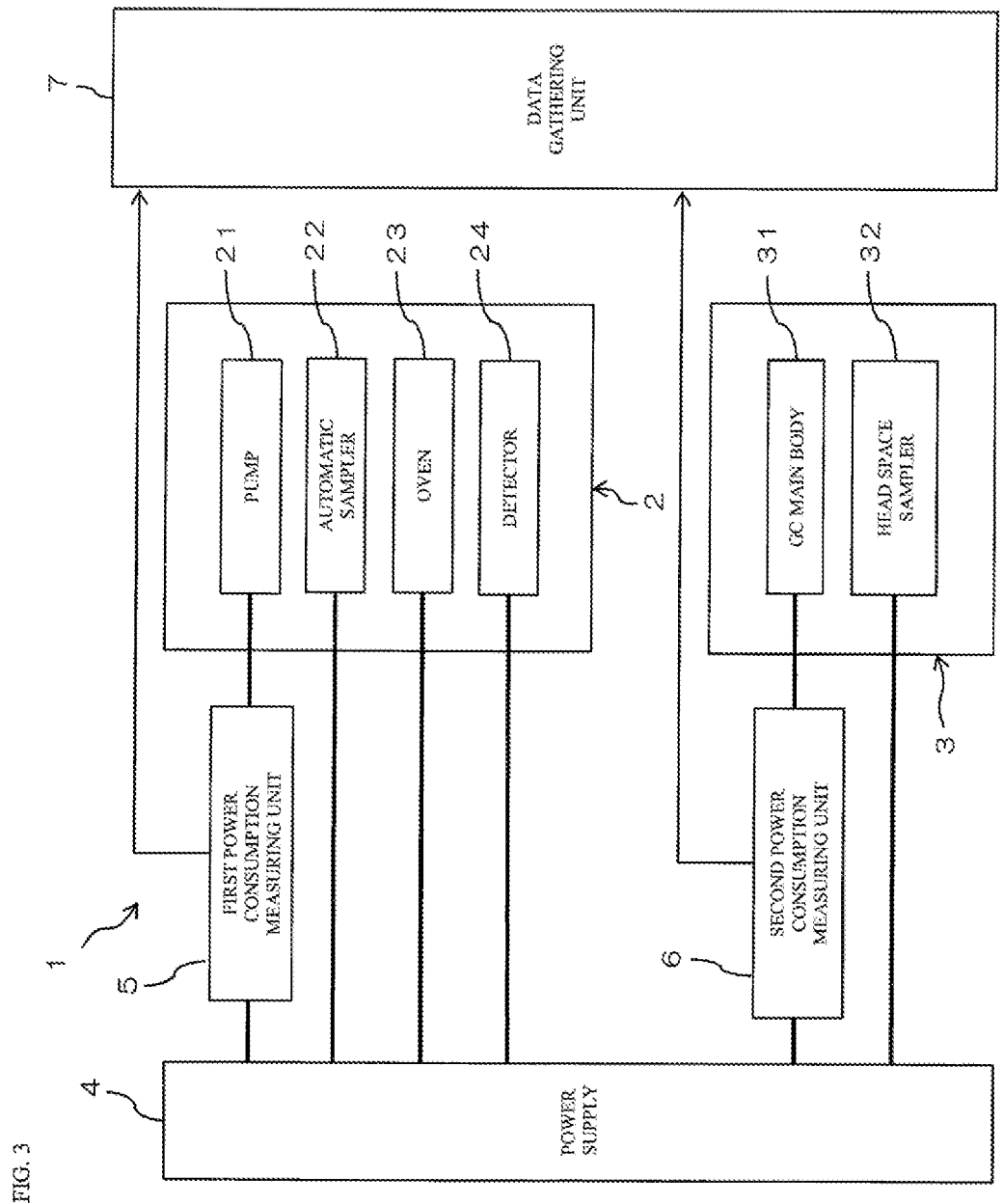
FIG. 3 is a schematic diagram of the configuration of an analysis control system according to a second embodiment of the present invention.

(1) Specific Configurations of First Power Consumption Measuring Unit and Second Power Consumption Measuring Unit FIG. 3 is a schematic diagram of the configuration of an analysis control system 1 according to the second embodiment of the present invention. FIG. 4 is a block diagram of the specific configurations of a first power consumption measuring unit 5, a second power consumption measuring unit 6, and peripheral members around the units of the analysis control system 1 in FIG. 3.

In the foregoing first embodiment, the analysis control system 1 includes the data processing unit 8. The data processing unit 8 controls acquiring the pieces of operating information on the units.

On the other hand, in the second embodiment, in the analysis control system 1, the first power consumption measuring unit 5 and the second power consumption measuring unit 6 perform main control of acquiring the pieces of operating information on the units.

More specifically, in the second embodiment, in the analysis control system 1 as illustrated in FIG. 3, the data processing unit 8 of the first embodiment is omitted. As illustrated in FIG. 4, the first power consumption measuring unit 5 includes a first storage unit 51 and a first control unit 52. The second power consumption measuring unit 6 includes a second storage unit 61 and a second control unit 62.

The first storage unit 51 is configured with a read only memory (ROM), a random access memory (RAM), and a hard disk, for example. The first storage unit 51 memorizes device configuration information 511. Note that the device configuration information 511 is information similar to the device configuration information 831 (the device configuration information 831 related to the liquid chromatograph 2) in the first embodiment.

The first control unit 52 includes a central processing unit (CPU), for example. The first control unit 52 inputs electrical signals to a data gathering unit 7. The first control unit 52 reads information memorized on the first storage unit 51 as necessary. The first control unit 52 functions as a first measuring unit 521, a first operating time period calculating unit 522, a first operating information acquiring unit 523, and the like by the CPU that executes programs.

The first measuring unit 521 is configured to measure the power consumption of a pump 21 of a liquid chromatograph 2.

The first operating time period calculating unit 522 calculates the operating time period of the pump 21 based on the power consumption of the pump 21 measured at the first measuring unit 521.

The first operating information acquiring unit 523 acquires the operating time periods of an automatic sampler 22, an oven 23, and a detector 24 that are the target units of the liquid chromatograph 2 based on the operating time period of the pump 21 calculated at the first operating time period calculating unit 522 and the device configuration information 511 memorized on the first storage unit 51. The data gathering unit 7 receives the input of information on the operating time periods of the units acquired at the first operating information acquiring unit 523.

The second storage unit 61 is configured with a ROM, a RAM, and a hard disk, for example. The second storage unit 61 memorizes device configuration information 611. Note that the device configuration information 611 is information similar to the device configuration information 831 of the first embodiment (the device configuration information 831 on the gas chromatograph 3).

The second control unit 62 includes a CPU, for example. The second control unit 62 inputs electrical signals to the data gathering unit 7. The second control unit 62 reads information memorized on the second storage unit 61 as necessary. The second control unit 62 functions as a second measuring unit 621, a second operating time period calculating unit 622, a second operating information acquiring unit 623, and the like by the CPU that executes programs.

The second measuring unit 621 is configured to measure the power consumption of a gas chromatograph main body 31 of a gas chromatograph 3.

The second operating time period calculating unit 622 calculates the operating time period of the gas chromatograph main body 31 based on the power consumption of the gas chromatograph main body 31 measured at the second measuring unit 621.

The second operating information acquiring unit 623 acquires the operating time period of a head space sampler 32 that is the target unit of the gas chromatograph 3 based on the operating time period of the gas chromatograph main body 31 calculated at the first operating time period calculating unit 622 and the device configuration information 611 memorized on the second storage unit 61. The data gathering unit 7 receives the input of the information on the operating time periods of the units acquired at the second operating information acquiring unit 623.

(2) Control Operation of First Power Consumption Measuring Unit and Second Power Consumption Measuring Unit After the analysis operation is performed in the liquid chromatograph 2 and the gas chromatograph 3, the first measuring unit 521 measures the power consumption of the pump 21 of the liquid chromatograph 2, and the second measuring unit 621 measures the power consumption of the gas chromatograph main body 31 of the gas chromatograph 3.

In the first power consumption measuring unit 5, the first operating time period calculating unit 522 calculates the operating time period of the pump 21 of the liquid chromatograph 2 based on the power consumption of the pump 21 of the liquid chromatograph 2 measured at the first measuring unit 521. The first operating information acquiring unit 523 acquires the operating time periods of the automatic sampler 22, the oven 23, and the detector 24 that are the target units of the liquid chromatograph 2 based on the operating time period of the pump 21 calculated at the first operating time period calculating unit 522 and the device configuration information 511 memorized on the first storage unit 51. The data gathering unit 7 receives the input of the information on the units (the information on the operating time periods) acquired at the first operating time period calculating unit 522.

In the second power consumption measuring unit 6, the second operating time period calculating unit 622 calculates the operating time period of the gas chromatograph main body 31 of the gas chromatograph 3 based on the power consumption of the gas chromatograph main body 31 of the gas chromatograph 3 measured at the second measuring unit 621. The second operating information acquiring unit 623 acquires the operating time period of the head space sampler 32 that is the target unit of the gas chromatograph 3 based on the operating time period of the gas chromatograph main body 31 calculated at the second operating time period calculating unit 622 and the device configuration information 611 memorized on the second storage unit 61. The data gathering unit 7 receives the input of the information on the units (the information on the operating time periods) acquired at the second operating time period calculating unit 622.

The data gathering unit 7 displays the inputted information on a display unit (not shown), for example, as necessary.

(3) Operation and Effect of Second Embodiment

Figure 4:
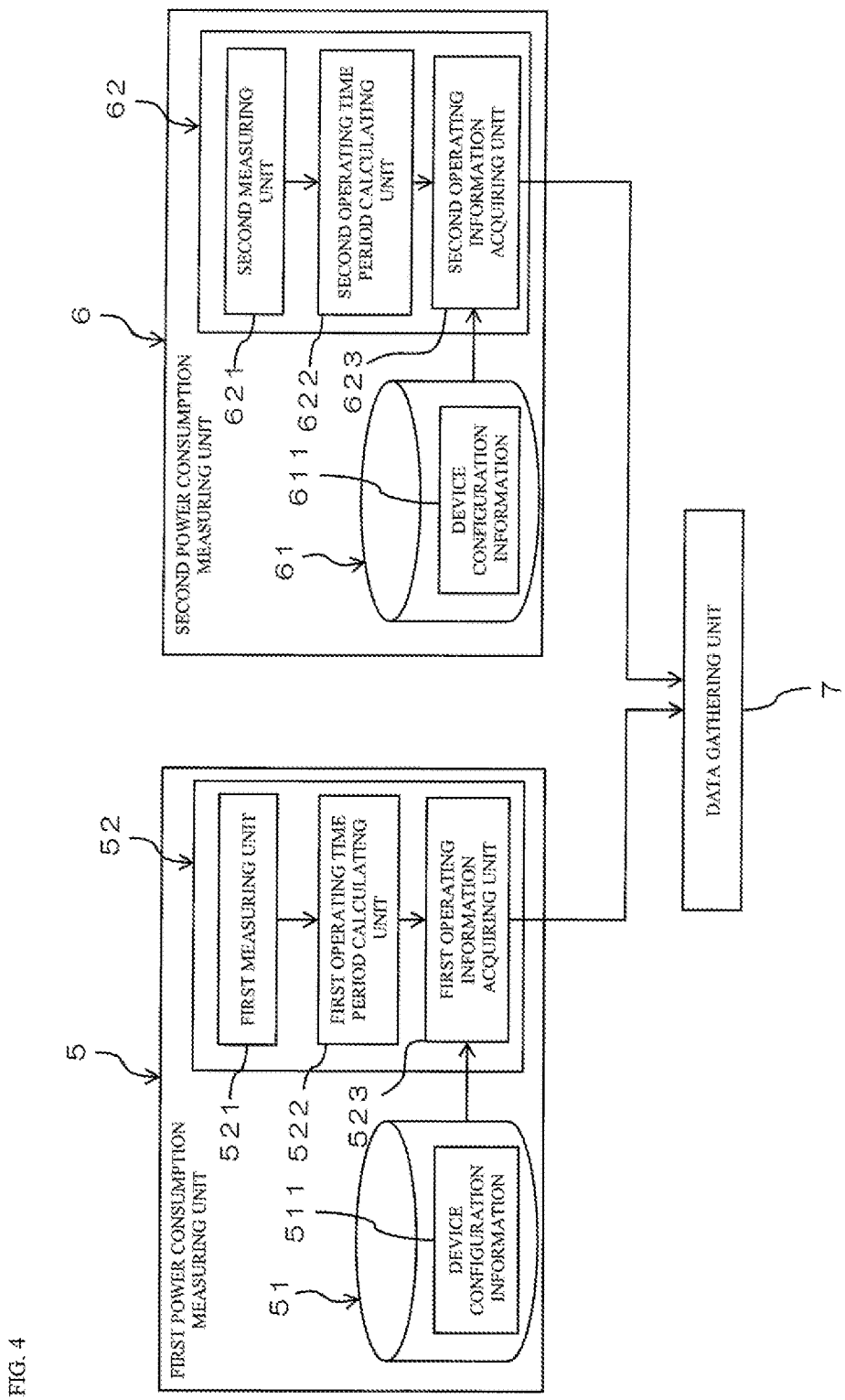
FIG. 4 is a block diagram of the specific configurations of a first power consumption measuring unit, a second power consumption measuring unit, and peripheral members around these units of the analysis control system in FIG. 3.

In the second embodiment as illustrated in FIG. 4, the first power consumption measuring unit 5 includes the first storage unit 51 and the first control unit 52. The first storage unit 51 memorizes the device configuration information 511. The first control unit 52 functions as the first measuring unit 521, the first operating time period calculating unit 522, the first operating information acquiring unit 523, and the like. The second power consumption measuring unit 6 includes the second storage unit 61 and the second control unit 62. The second storage unit 61 memorizes the device configuration information 611. The second control unit 62 functions as the second measuring unit 621, the second operating time period calculating unit 622, the second operating information acquiring unit 623, and the like.

In the analysis control system 1, the first power consumption measuring unit 5 and the second power consumption measuring unit 6 perform the main control of acquiring the pieces of operating information on the units (the operating time periods) of the liquid chromatograph 2 and the gas chromatograph 3.

Thus, the members other than the first power consumption measuring unit 5 and the second power consumption measuring unit 6 in the analysis control system 1 can be simply configured.

6. Third Embodiment

In the following, referring to FIGS. 5 and 6, a third embodiment of the present invention will be described.

(1) Configurations of Setting Information Acquiring Unit and Error

Information Acquiring Unit

Figure 5:
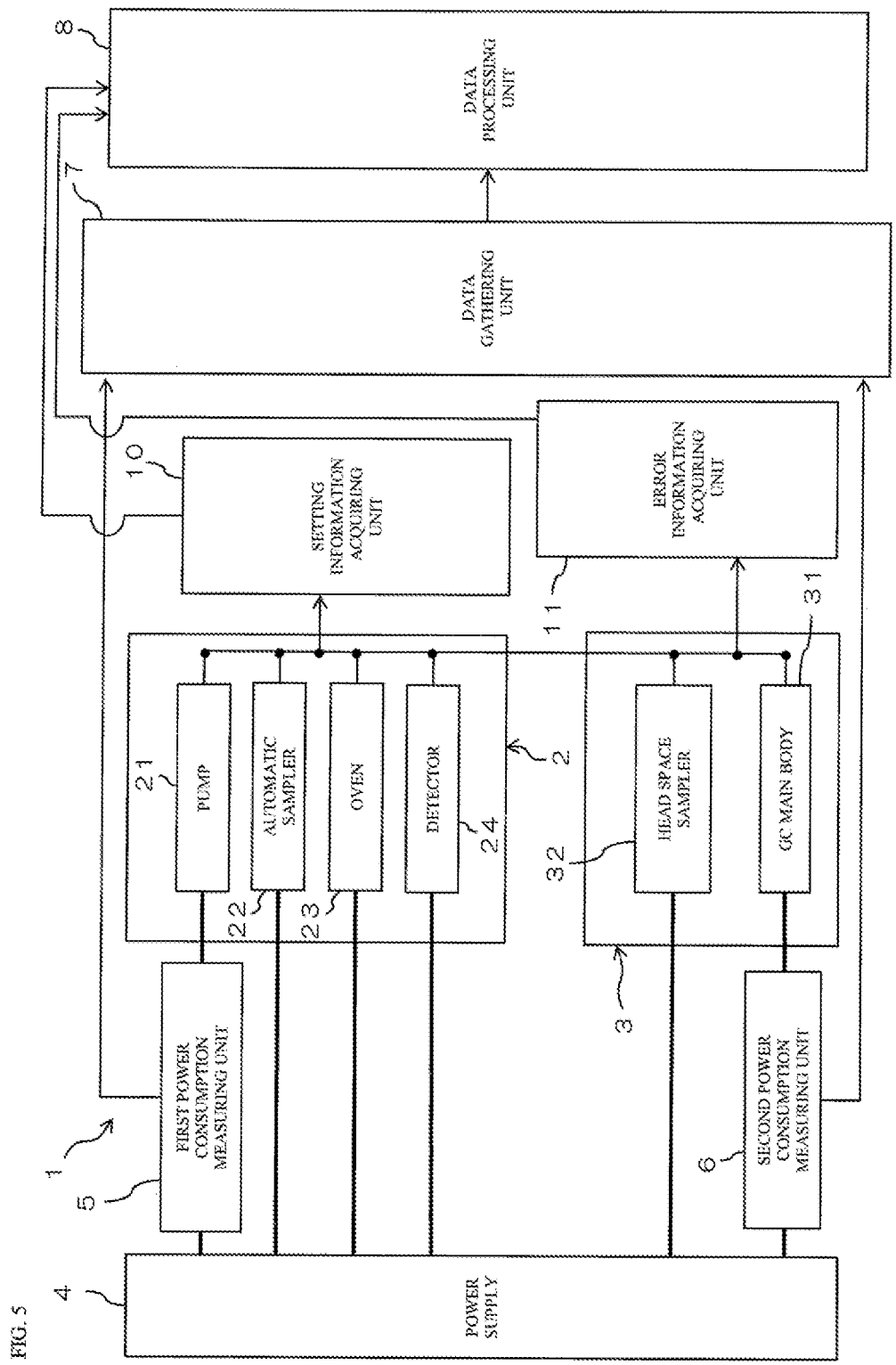
FIG. 5 is a schematic diagram of the configuration of an analysis control system according to a third embodiment of the present invention.

FIG. 5 is a schematic diagram of the configuration of an analysis control system 1 according to the third embodiment of the present invention. FIG. 6 is a block diagram of the specific configurations of a data processing unit 8 and peripheral members around the data processing unit 8 of the analysis control system 1 in FIG. 5.

In the foregoing first embodiment, in the analysis control system 1, the operating information acquiring unit 842 acquires the pieces of operating information on the units of the analyzers (the liquid chromatograph 2 and the gas chromatograph 3).

On the other hand, in the third embodiment, in the analysis control system 1, an operating information acquiring unit 842 also acquires operating information on components included in the units of analyzers in addition to the pieces of operating information on the units.

More specifically, as illustrated in FIG. 5, in the third embodiment, the analysis control system 1 further includes a setting information acquiring unit 10 and an error information acquiring unit 11.

Note that the units of a liquid chromatograph 2 and the units of a gas chromatograph 3 include pluralities of components, and hold setting information related to the operation of these components. For example, a pump 21 of the liquid chromatograph 2 includes a valve that is a component, and holds setting information related to the operation of this valve (not shown).

The setting information acquiring unit 10 is electrically connected to the units of the liquid chromatograph 2 and the units of the gas chromatograph 3. Specifically, the setting information acquiring unit 10 is electrically connected to the pump 21, an automatic sampler 22, an oven 23, and a detector 24 of the liquid chromatograph 2 and a gas chromatograph main body 31 and a head space sampler 32 of the gas chromatograph 3.

The setting information acquiring unit 10 acquires the pieces of setting information on the components included in the units of the liquid chromatograph 2 and the units of the gas chromatograph 3.

Note that the term "setting information on the components" means information on the number of times of a predetermined operation on a component in the case where the units are operated for unit time, for example. For example, the pump 21 of the liquid chromatograph 2 holds, as setting information, information how many times the valve that is a component is operated in the case where the pump 21 is operated for unit time.

The error information acquiring unit 11 is electrically connected to the units of the liquid chromatograph 2 and the units of the gas chromatograph 3. Specifically, the error information acquiring unit 11 is electrically connected to the pump 21, the automatic sampler 22, the oven 23, and the detector 24 of the liquid chromatograph 2 and the gas chromatograph main body 31 and the head space sampler 32 of the gas chromatograph 3.

The error information acquiring unit 11 acquires information (error information) related to errors that occur in the components included in the units of the liquid chromatograph 2 and the components included in the units of the gas chromatograph 3. The error information may include information on time for which the components are not in operation due to errors, for example.

(2) Control Operation by Control Unit

After the analysis operation is performed in the liquid chromatograph 2 and the gas chromatograph 3, the setting information acquiring unit 10 acquires setting information on the components included in the units of the liquid chromatograph 2 and setting information on the components included in the units of the gas chromatograph 3.

The error information acquiring unit 11 acquires error information in the case where errors occur in the components included in the units of the liquid chromatograph 2 and the components included in the units of the gas chromatograph 3.

Figure 6:
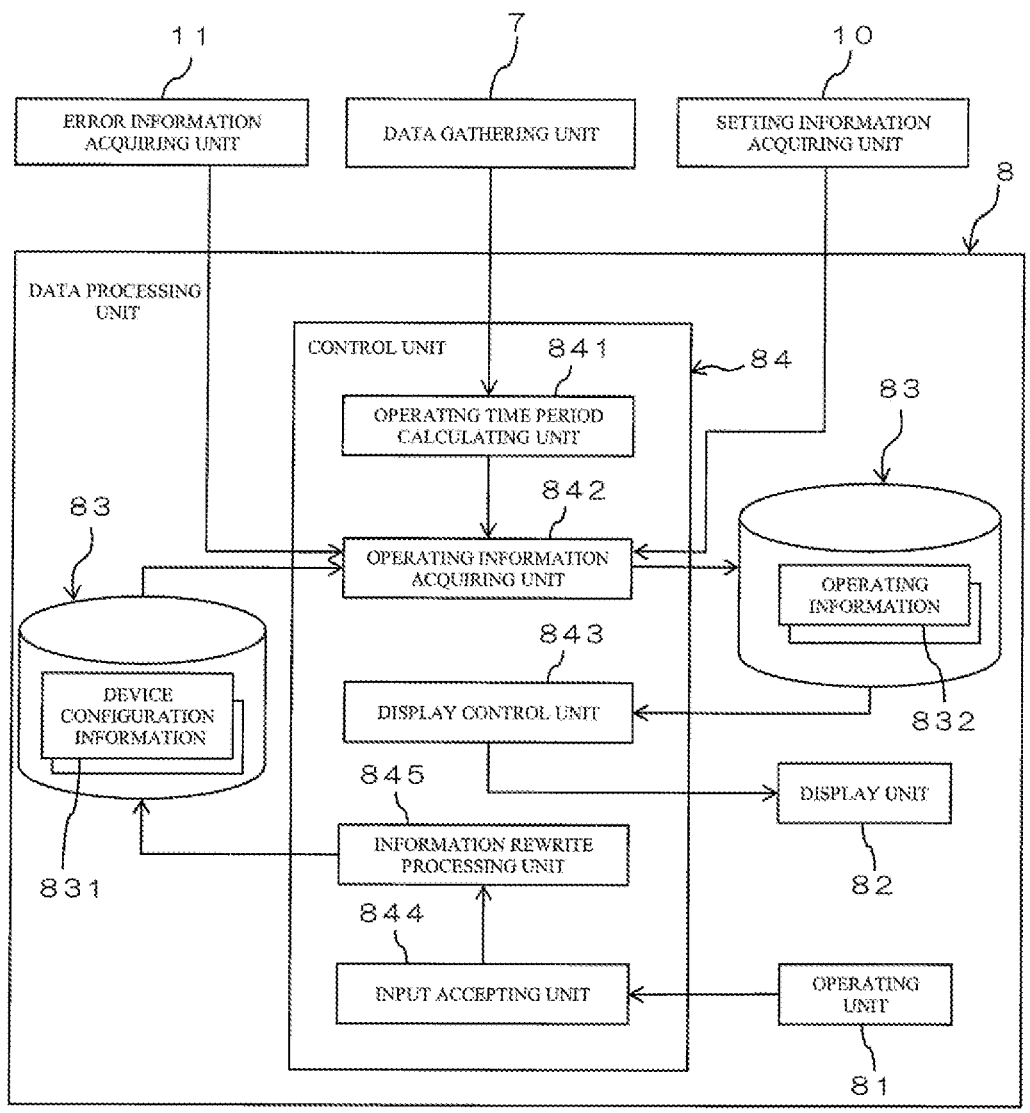
FIG. 6 is a block diagram of the specific configurations of a data processing unit and peripheral members around the data processing unit of the analysis control system in FIG. 5.

As illustrated in FIG. 6, similarly to the first embodiment, the operating information acquiring unit 842 acquires the operating time periods of the units of the liquid chromatograph 2 and the operating time periods of the units of the gas chromatograph 3.

The operating information acquiring unit 842 acquires operating information on the components of the units based on the operating time periods of the units and setting information on the components of the units acquired at the setting information acquiring unit 10. In this example, the operating information acquiring unit 842 calculates (acquires) the number of times of a predetermined operation in the components of the units as operating information.

At this time, in the case where the error information acquiring unit 11 acquires error information on the components of the units, the operating information acquiring unit 842 acquires operating information on the components corrected based on the error information.

The information on the components of the units thus acquired at the operating information acquiring unit 842 is stored as operating information 832 on a storage unit 83. A display control unit 843 displays the content of the operating information 832 as the operating status of the components of the units on a display unit 82.

(3) Operation and Effect of Third Embodiment

In the third embodiment, the analysis control system 1 further includes the setting information acquiring unit 10. The setting information acquiring unit 10 acquires setting information on the components included in the units. The operating information acquiring unit 842 acquires operating information on the components based on setting information on the components acquired at the setting information acquiring unit 10.

Thus, the operating information acquiring unit 842 can acquire operating information on the components in addition to the pieces of operating information on the units.

As a result, in the analysis control system 1, the operating status of the components can be managed in addition to the operating status of the units.

In the third embodiment, the analysis control system 1 further includes the error information acquiring unit 11. The error information acquiring unit 11 acquires error information on the components included in the units. The operating information acquiring unit 842 acquires operating information on the components based on setting information on the components acquired at the setting information acquiring unit 10 and error information on the components acquired at the error information acquiring unit 11.

Thus, in the case where errors occur in the components, the error information can be reflected on the operating information on the components acquired at the operating information acquiring unit 842.

As a result, the operating information acquiring unit 842 can highly accurately acquire operating information on the components.

7. Modifications

In the foregoing embodiments, the description is made in which the analysis control system 1 includes the liquid chromatograph 2 and the gas chromatograph 3 that are analyzers. However, the analysis control system 1 may include a given analyzer, such as a mass spectrometer, spectrophotometer, total organic carbon analyzer, infrared microscope, and electron microscope, other than the liquid chromatograph 2 and the gas chromatograph 3. Operating information on the target unit may be acquired by the measurement of the power consumption of the reference units included in this analyzer.

In the foregoing embodiments, the description is made in which the operating information is the operating time period or the number of times of operation. However, the operating information is not limited to the operating time period or the number of times of operation. For example, the operating information may include various pieces of information indicating the operating status of the units or the components, such as the operating date and time.

DESCRIPTION OF REFERENCE SIGNS

1 analysis control system
2 liquid chromatograph
3 gas chromatograph
5 first power consumption measuring unit
6 second power consumption measuring unit
10 setting information acquiring unit
11 error information acquiring unit
21 pump
22 automatic sampler
23 oven
24 detector 31 gas chromatograph main body
32 head space sampler
51 first storage unit
52 first control unit
61 second storage unit
62 second control unit
83 storage unit
84 control unit
511 device configuration information
522 first operating time period calculating unit
523 first operating information acquiring unit
611 device configuration information
622 second operating time period calculating unit
623 second operating information acquiring unit
831 device configuration information
832 operating information
841 operating time period calculating unit
842 operating information acquiring unit
844 input accepting unit
845 information rewrite processing unit

The invention claimed is:

1. An analysis control system comprising:
a plurality of analyzers configured to analyze a sample using a plurality of units;
a plurality of power consumption measuring units configured to measure power consumption of a reference unit included in the plurality of units of the analyzers; and
an operating information acquiring unit configured to acquire operating information on a target unit that is a unit other than the reference unit of the analyzers based on power consumption of the reference units measured at the power consumption measuring units.

2. The analysis control system according to claim 1, wherein
the reference unit is a unit having a highest operating rate in the plurality of units of the analyzers.

3. The analysis control system according to claim 1, further comprising:
an operating time period calculating unit configured to calculate operating time periods of the reference units based on power consumption of the reference units measured at the power consumption measuring units; and
a storage unit configured to memorize a ratio of operating time periods between the reference unit and the target unit of the analyzers as device configuration information,
wherein
the operating information acquiring unit acquires an operating time period of the target unit as the operating information based on operating time periods of the reference units calculated at the operating time period calculating unit and the device configuration information memorized on the storage unit.

4. The analysis control system according to claim 3, further comprising:
an input accepting unit configured to accept an input of the device configuration information; and
an information rewrite processing unit configured to rewrite the device configuration information memorized on the storage unit when the input accepting unit accepts an input of the device configuration information.

5. The analysis control system according to claim 1, wherein
the plurality of power consumption measuring units includes
an operating time period calculating unit configured to calculate operating time periods of the reference units based on power consumption of the reference units measured at the power consumption measuring units, and
a storage unit configured to memorize a ratio of operating time periods between the reference unit and the target unit of the analyzers as device configuration information,
wherein
the operating information acquiring unit acquires an operating time period of the target unit as the operating information based on operating time periods of the reference units calculated at the operating time period calculating unit and the device configuration information memorized on the storage unit.

6. The analysis control system according to claim 1, further comprising
a setting information acquiring unit configured to acquire setting information on operation of a plurality of components included in the plurality of units,
wherein
the operating information acquiring unit acquires operating information on the components based on setting information on the components acquired at the setting information acquiring unit.

7. The analysis control system according to claim 6, further comprising
an error information acquiring unit configured to acquire error information on the plurality of components of the analyzers,
wherein
the operating information acquiring unit acquires operating information on the components based on setting information on the components acquired at the setting information acquiring unit and error information on the components acquired at the error information acquiring unit.

* * * * *